(12) United States Patent
Kim et al.

(10) Patent No.: US 11,830,541 B2
(45) Date of Patent: Nov. 28, 2023

(54) MEMORY CONTROLLER PERFORMING DATA TRAINING, SYSTEM-ON-CHIP INCLUDING THE MEMORY CONTROLLER, AND OPERATING METHOD OF THE MEMORY CONTROLLER

(71) Applicant: SAMSUNG ELECTRONICS CO., LTD., Suwon-si (KR)

(72) Inventors: Daero Kim, Hwaseong-si (KR); Kyunghoi Koo, Suwon-si (KR); Sujeong Kim, Hwaseong-si (KR); Juyoung Kim, Hwaseong-si (KR); Sanghune Park, Seongnam-si (KR); Jiyeon Park, Suwon-si (KR); Jihun Oh, Hwaseong-si (KR); Kyoungwon Lee, Uijeongbu-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 109 days.

(21) Appl. No.: 17/569,679

(22) Filed: Jan. 6, 2022

(65) Prior Publication Data
US 2022/0392520 A1 Dec. 8, 2022

(30) Foreign Application Priority Data
Jun. 8, 2021 (KR) .......................... 10-2021-0074295

(51) Int. Cl.
*G11C 11/4076* (2006.01)
*G11C 11/4096* (2006.01)
(Continued)

(52) U.S. Cl.
CPC ...... *G11C 11/4096* (2013.01); *G11C 11/4076* (2013.01); *G06F 13/1689* (2013.01);
(Continued)

(58) Field of Classification Search
CPC ............ G11C 11/4076; G11C 11/4096; G11C 11/4093; G11C 7/1084; G11C 7/1093; G11C 7/14; G06F 13/1689
(Continued)

(56) References Cited

U.S. PATENT DOCUMENTS 6,169,765 B1 1/2001 Holcombe
7,099,786 B2 8/2006 Nguyen et al.
(Continued)

OTHER PUBLICATIONS

Communication dated Dec. 6, 2022 issued by the Taiwanese Patent Office in counterpart Taiwanese Patent Application No. 111116308.

*Primary Examiner* — Ly D Pham
(74) *Attorney, Agent, or Firm* — Sughrue Mion, PLLC

(57) ABSTRACT

A memory controller includes a first receiver configured to compare a read reference voltage with a piece of data received through a first data line and output a first piece of data; a first duty adjuster configured to adjust a duty of the first piece of data; a second receiver configured to compare the read reference voltage with a piece of data received through a second data line and output a second piece of data; a second duty adjuster configured to adjust a duty of the second piece of data; and a training circuit configured to perform a training operation on pieces of data received through a plurality of data lines, to obtain a target read reference voltage for each piece of data and correct a duty of each piece of data based on a level of the target read reference voltage for each piece of data.

10 Claims, 19 Drawing Sheets

(51) Int. Cl.
   *G06F 13/16*    (2006.01)
   *G11C 7/10*     (2006.01)
   *G11C 11/4093*  (2006.01)
   *G11C 7/14*     (2006.01)

(52) U.S. Cl.
   CPC .......... *G11C 7/1066* (2013.01); *G11C 7/1084* (2013.01); *G11C 7/1093* (2013.01); *G11C 7/14* (2013.01); *G11C 11/4093* (2013.01)

(58) Field of Classification Search
   USPC ........................................................ 711/154
   See application file for complete search history.

(56) References Cited

U.S. PATENT DOCUMENTS

| | | |
|---|---|---|
| 8,644,085 B2 | 2/2014 | Kim et al. |
| 8,923,442 B2 | 12/2014 | Chandrasekaran |
| 8,948,212 B2 | 2/2015 | Zerbe et al. |
| 9,666,264 B1 | 5/2017 | Jeter et al. |
| 10,347,319 B2 | 7/2019 | Mozak et al. |
| 2013/0094286 A1 | 4/2013 | Sridharan et al. |
| 2020/0133542 A1* | 4/2020 | Kim ..................... G06F 3/0673 |
| 2020/0152287 A1 | 5/2020 | Kim |

* cited by examiner

MEMORY CONTROLLER PERFORMING DATA TRAINING, SYSTEM-ON-CHIP INCLUDING THE MEMORY CONTROLLER, AND OPERATING METHOD OF THE MEMORY CONTROLLER

CROSS-REFERENCE TO THE RELATED APPLICATION

This application is based on and claims priority under 35 U.S.C. § 119 to Korean Patent Application No. 10-2021-0074295, filed on Jun. 8, 2021, in the Korean Intellectual Property Office, the disclosure of which is incorporated by reference herein in its entirety.

BACKGROUND

The inventive concept relates to a memory controller, and more particularly, to a memory controller performing data training, a system-on-chip (SoC) including the memory controller, and an operating method of the memory controller.

A memory controller or an SoC including the memory controller may perform communication with a memory device through a high-speed interface. As an example, the SoC is an integrated circuit in which a plurality of components of an electronic system or intellectual properties (IPs) are integrated, and may perform training on a memory device before communicating with the memory device. As an example, the SoC may perform ZQ calibration, reference voltage training, read training, write training, clock signal training, and the like on the memory device.

In addition, the SoC may exchange data with the memory device through a plurality of data lines. In this case, because physical characteristics of the data lines may be different from each other, signal characteristics of data transmitted through each of the data lines may vary. As an example, deviation of a swing level between data lines may increase due to a signal integrity (SI) characteristic, etc., and there is a problem in that it is difficult to correct deviation of a swing level or reduce a duty error in high-speed communication.

SUMMARY

The inventive concept provides a memory controller capable of compensating for deviation of a swing level between data lines and reducing a duty error, a system-on-chip (SoC) including the memory controller, and an operating method of the memory controller.

According to an aspect of the inventive concept, there is provided a memory controller in communication with a memory device, the memory controller including: a first receiver configured to compare a read reference voltage with a piece of data received through a first data line and configured to output a first piece of data; a first duty adjuster connected to an output of the first receiver and configured to adjust a duty of the first piece of data; a second receiver configured to compare the read reference voltage with a piece of data received through a second data line and configured to output a second piece of data; a second duty adjuster connected to an output of the second receiver and configured to adjust a duty of the second piece of data; and a training circuit configured to perform a training operation on pieces of data received through a plurality of data lines, to obtain a target read reference voltage for each of the pieces of data and correct a duty of each of the pieces of data based on a level of the target read reference voltage for each of the pieces of data, wherein based on a result of the training operation, the duty of the first piece of data and the duty of the second piece of data are differently adjusted based on a level of a first target read reference voltage obtained for the first piece of data being different from a level of a second target read reference voltage obtained for the second piece of data.

According to another aspect of the inventive concept, there is provided a system-on-chip (SoC) in communication with a memory device, the SoC including a memory control unit configured to control an operation of the memory device; and a double data rate physical layer (DDR PHY) configured to exchange commands and/or addresses and data with the memory device, wherein the DDR PHY includes: an input/output circuit including: a first receiver through an N-th receiver configured to receive, in parallel, pieces of data read from the memory device; and a first duty adjuster through an N-th duty adjuster arranged to respectively correspond to the first through the N-th receivers and configured to respectively adjust a duty of a corresponding piece of data (where N is an integer greater than or equal to 2); and a training circuit configured to perform a training operation on the pieces of data, to obtain a target read reference voltage for each of the pieces of data and correct a duty of each of the pieces of data based on a level of the target read reference voltage for each of the pieces of data, wherein a read reference voltage of a same level is provided to the first through the N-th receivers, and wherein, in a normal read operation, the first through the N-th duty adjusters are configured to differently adjust duties of the pieces of data based on a result of the training operation.

According to another aspect of the inventive concept, there is provided an operating method of a memory controller that performs training on pieces of data from a memory device, the operating method including: obtaining, with respect to pieces of data received through a plurality of receivers, a target read reference voltage level for each of the pieces of data and a common read reference voltage level for the pieces of data by searching for a valid window margin of the pieces of data while changing a level of a read reference voltage provided in common to the plurality of receivers; correcting a duty of at least one of the pieces of data based on a first difference between the target read reference voltage level obtained for at least one of the pieces of data and the common read reference voltage level; repeating the obtaining and the correcting in a state in which the duty of the at least one of the pieces is corrected; and obtaining, based on a result of the repeating, a duty correction value for each of the pieces of data.

BRIEF DESCRIPTION OF THE DRAWINGS

Example embodiments of the inventive concept will be more clearly understood from the following detailed description taken in conjunction with the accompanying drawings in which.

DETAILED DESCRIPTION

Hereinafter, embodiments of the inventive concept will be described in detail with reference to the accompanying drawings.

Figure 1:
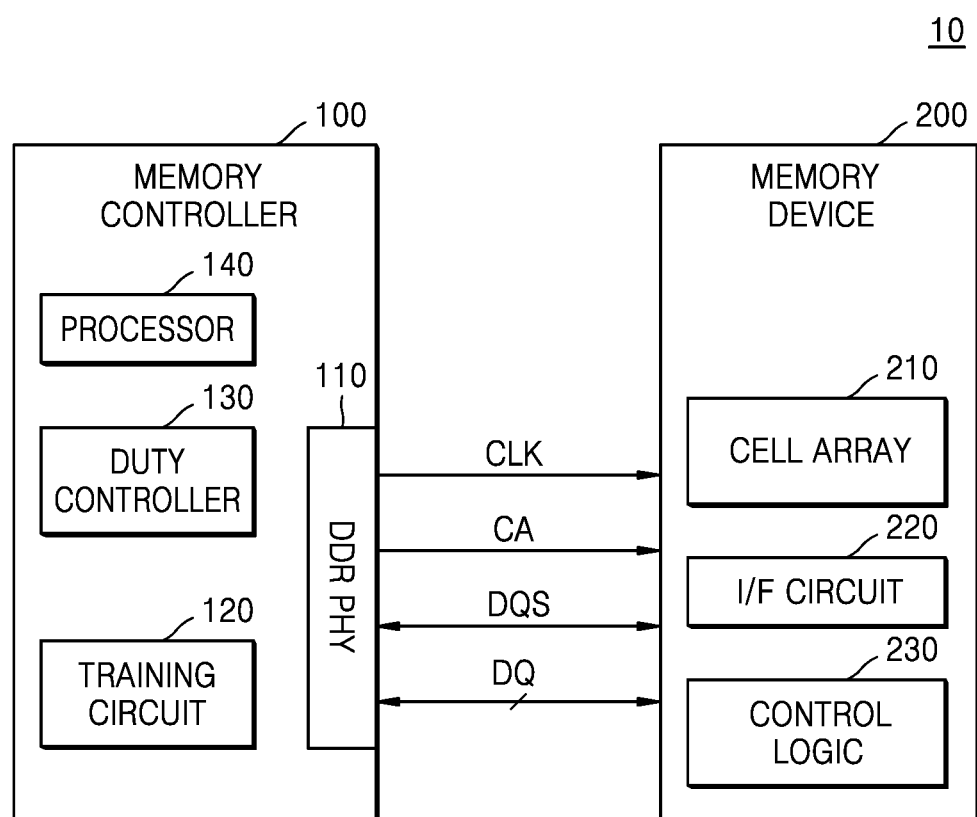
FIG. 1 is a block diagram of a memory system including a memory controller according to an example embodiment of the inventive concept.

FIG. 1 is a block diagram of a memory system including a memory controller according to an example embodiment of the inventive concept.

A memory system 10 may include a memory controller 100 and a memory device 200. The memory system 10 may refer to an integrated circuit, an electronic device or system, a smartphone, a tablet personal computer (PC), a computer, a server, a workstation, a portable communication terminal, a personal digital assistant (PDA), a portable multimedia player (PMP), a computing device such as other suitable computers, a virtual machine or virtual computing device thereof, or the like. Alternatively, the memory system 10 may include some of components in a computing system such as a graphics card.

The memory device 200 may be dynamic random access memory (DRAM) such as Double Data Rate Synchronous Dynamic Random Access Memory (DDR SDRAM), Low Power Double Data Rate (LPDDR) SDRAM, Graphics Double Data Rate (GDDR) SDRAM, or Rambus Dynamic Random Access Memory (RDRAM). However, embodiments of the inventive concept are not limited thereto. As an example, the memory device 200 may include non-volatile memory such as flash memory, magnetic RAM (MRAM), ferroelectric RAM (FeRAM), phase change RAM (PRAM), or Resistive RAM (ReRAM).

The memory controller 100 may include a processor 140 that controls operations related to memory operations, and a memory interface. According to an example embodiment, the memory interface may include a double data rate physical layer (DDR PHY) 110. The DDR PHY 110 may support features of the DDR and/or LPDDR protocol of the Joint Electron Device Engineering Council (JEDEC) standard. The memory controller 100 may control the memory device 200 through the DDR PHY 110, and the DDR PHY 110 may communicate with the memory device 200 according to a DDR PHY interface (DFI) method. As an example, the memory controller 100 may provide a clock signal CLK and a command/address CA to the memory device 200 through the DDR PHY 110, and may transmit/receive a data strobe signal DQS and data DQ to/from the memory device 200.

According to an embodiment, the memory device 200 may include a high bandwidth memory (HBM) including a plurality of independent channels, and when the memory device 200 includes an HBM, the memory interface provided in the memory controller 100 may be an HBM PHY.

The data strobe signal DQS may be used to sample the data DQ, and the memory controller 100 may receive data DQ including a plurality of data bits in parallel through a plurality of data lines (DQ lines) or provide data DQ to the memory device 200 in parallel. That is, the memory controller 100 may bidirectionally exchange data DQ with the memory device 200. The data strobe signal DQS may include a write DQS and a read DQS, and the data DQ may include write data and read data.

The memory controller 100 may access the memory device 200 in response to a request from a host, and may communicate with the host by using various protocols. For example, the memory controller 100 may communicate with the host by using an interface protocol such as Peripheral Component Interconnect-Express (PCI-E), Advanced Technology Attachment (ATA), Serial ATA (SATA), Parallel ATA (PATA), or serial attached SCSI (SAS). In addition, various other interface protocols such as Universal Serial Bus (USB), Multi-Media Card (MMC), Enhanced Small Disk Interface (ESDI), or Integrated Drive Electronics (IDE) may be applied to a protocol between the host and the memory controller 100.

The memory device 200 may include a cell array 210, an interface circuit 220, and control logic 230. The cell array 210 may include a plurality of memory cells, and the interface circuit 220 may provide an interface with the memory controller 100. As an example, the interface circuit 220 may include a DDR PHY. In addition, the control logic 230 may control operations of the memory device 200. For example, the control logic 230 may perform memory operations such as reading and writing data based on the command/address CA provided from the memory controller 100. The memory controller 100 may provide the command/address CA to the memory device 200 in synchronization with the clock signal CLK.

Hereinafter, a training operation according to embodiments of the inventive concept is described. For illustrative purposes, it is assumed that the data DQ is read data read from the memory device 200 and provided to the memory controller 100.

Each of the memory controller 100 and the memory device 200 may have various operating characteristics. Accordingly, when the memory system 10 is initially driven, the memory controller 100 may perform training on the memory device 200. A training circuit 120 may control various operations related to training, and may perform, for example, training for securing a valid window margin (VWM) of data. Specifically, the training operation may include training of a read DQS and read data (or skew training between a read DQS and read data), training of a read reference voltage for discrimination of read data, training of a duty cycle of the clock signal CLK, training of a write DQS and write data (or skew training between a write DQS and write data), training of a write reference voltage for discrimination of write data, and the like. Training for data duty correction in an embodiment of the inventive concept will be referred to as data training (or data duty training). Data training according to an embodiment of the inventive concept may include at least one of various operations included in the various training processes described above. Alternatively, data training related to duty correction in an embodiment of the inventive concept may be defined as operations included in a training process of read data or as including a training process of read data. In addition, in an example embodiment of the inventive concept, a VWM of data may be searched for while the level of a read reference voltage is changed in relation to the duty correction of the data, and accordingly, the training operation according to an embodiment of the inventive concept may be defined as including a read reference voltage training process or as being included in the read reference voltage training process.

In addition, in the training process according to an embodiment of the inventive concept, a read reference voltage level corresponding to an optimal VWM (or a maximum VWM) for each piece of data may be calculated, and the calculated read reference voltage level will be referred to as an optimal read reference voltage level (also referred to as 'target read reference voltage level') for each piece of data. Also, a read reference voltage common to pieces of data may be calculated by searching for a VWM for the pieces of data, and will be referred to as a common read reference voltage. Through the training as described above, the level of a read reference voltage provided in common to a plurality of receivers in a normal data read operation may be set. In some embodiments, the common read reference voltage and the set read reference voltage may have the same level, and accordingly, the terms of common read reference voltage and set read reference voltage may be used interchangeably.

According to an example embodiment of the inventive concept, a correction value (or a duty correction value) for correcting the duty of data transmitted through a plurality of DQ lines through a training operation may be set. In high-speed communication, due to Signal Integrity (SI)/Power Integrity (PI) characteristics, a swing level deviation may increase between the plurality of DQ lines, and accordingly, when the same read reference voltage level is set for the plurality of DQ lines, deviation in the duty of read data received from the memory controller 100 may increase. In an example embodiment of the inventive concept, the duty of data output from each of a plurality of receivers (e.g., data receivers) of the DDR PHY 110 is differently adjusted, and as an example, a duty deviation of read data may be reduced by arranging a circuit (e.g., a duty adjuster (not shown)) for adjusting a duty at an output terminal of a receiver arranged to correspond to each DQ line and controlling the duty adjuster differently for each piece of data.

The training circuit 120 may perform a training operation for setting the level of a read reference voltage provided in common to a plurality of receivers in a normal read operation. For example, the training circuit 120 may search for a VWM of data while changing the level of the read reference voltage provided to the plurality of receivers, and may calculate, based on the VWM, an optimal read reference voltage and a common read reference voltage for each of pieces of data DQ. Also, after correcting the duty of data DQ in which the level of the optimal read reference voltage and the level of the common read reference voltage are different from each other, an operation of searching for the VWM may be performed again while changing the level of the read reference voltage in a state in which the duty of the data DQ is corrected. In addition, as the training process is repeated while correcting the duty of the data DQ, the level of the optimal read reference voltage calculated for each of the pieces of data DQ may be changed, and as the above process is repeated, a level difference between the optimal read reference voltage and the common read reference voltage calculated for each of the pieces of data DQ may be gradually reduced. Through the above process, even when a read reference voltage having a certain level is provided in common to a plurality of receivers, a correction value for each piece of data DQ capable of securing a large VWM may be calculated.

According to an example embodiment, the training circuit 120 may calculate the level of the common read reference voltage of pieces of data from the optimal read reference voltage calculated for each of the pieces of data DQ. The level of the read reference voltage may be set according to various methods, and as an example, an approximate average level of a plurality of optimal read reference voltages may be calculated and set as the level of the read reference voltage. Alternatively, the optimal read reference voltage having an approximately intermediate level among the plurality of optimal read reference voltages may be set as the level of the read reference voltage.

The training circuit 120 may provide, to the duty controller 130, information related to a correction value calculated based on a training result, and the duty controller 130 may output a duty control signal for adjusting the duty of each of the pieces of data DQ based on the correction value. The training circuit 120 may provide information for duty correction according to various methods. As an example, the training circuit 120 may provide, as the correction value described above, information indicating the amount and/or direction (e.g., a direction of increasing a logic high period or increasing a logic low period) of duty correction during the training process.

Alternatively, according to various example embodiments, the training circuit 120 may provide, as a correction value, information related to a difference between the level of an optimal read reference voltage calculated for each piece of data DQ and the level of a common read reference voltage set for the pieces of data DQ. For example, it may be determined whether to increase a logic high period or a logic low period for each piece of data DQ based on the level difference calculated for each piece of data DQ, and the amount of increasing the logic high period or the logic low period may be determined.

In the embodiment disclosed with reference to FIG. 1, the training circuit 120 and the duty controller 130 are illustrated as being arranged outside the DDR PHY 110. However, embodiments of the inventive concept are not limited thereto, and the training circuit 120 and the duty controller 130 may be arranged inside the DDR PHY 110. In addition, in embodiments of the inventive concept, the training circuit 120 may be described as performing a training operation using hardware, or as the processor 140 controls the training circuit 120 by executing instructions stored in an operation memory (not shown) in the memory controller 100, the training operation may be described as being performed using software.

Figure 2:
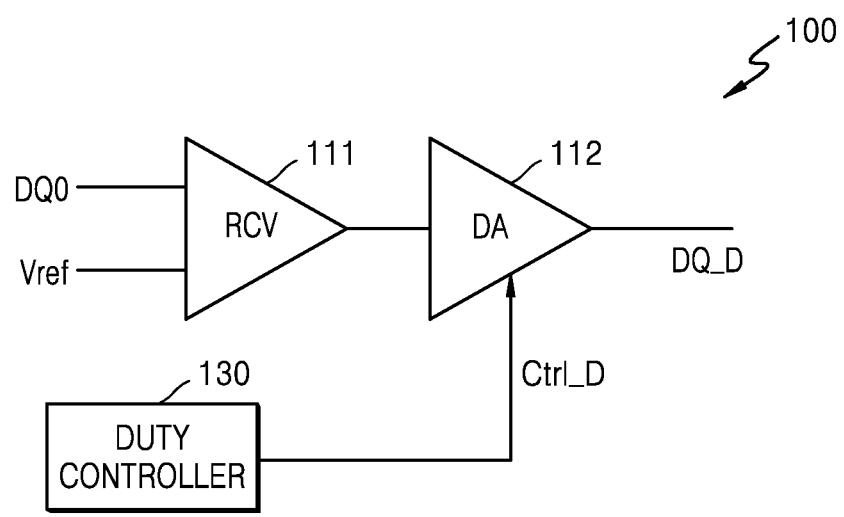
FIG. 2 is a block diagram illustrating a receiver and a duty adjuster arranged to correspond to each data line (DQ line) in a double data rate physical layer (DDR PHY) of FIG. 1.

A duty adjustment operation according to an example embodiment of the inventive concept will be described with reference to FIG. 2. FIG. 2 is a block diagram illustrating a receiver 111 and a duty adjuster 112 arranged to correspond to each DQ line in the DDR PHY 110 of FIG. 1. FIG. 2 illustrates an example of a data reception operation in a normal read operation.

The duty adjuster 112 may adjust a duty by adjusting a slew rate of received data, and may be referred to as a slew rate control circuit. In addition, adjusting the duty may be described as adjusting the duty of the data DQ received from the memory controller 100, and a signal output from each of the receiver 111 and the duty adjuster 112 may also be referred to as data DQ. For convenience of description, data received by the memory controller 100 and of which duty is adjusted will be referred to as duty-adjusted data DQ_D.

Referring to FIGS. 1 and 2, the receiver 111 may receive data DQ and a read reference voltage Vref, and may output data DQ having a logic state according to a result of comparing the data DQ with the read reference voltage Vref. The read reference voltage Vref may have a level set in common for a plurality of receivers through the training operation described in the above-described embodiment. Because the swing level characteristics of the DQ lines may be different from each other, the level of an optimal read reference voltage calculated in the training process for a piece of data DQ corresponding to the receiver 111 may be different from the level of the read reference voltage Vref provided to the receiver 111. Accordingly, the data DQ output from the receiver 111 may have poor duty characteristics, for example, may not have a duty ratio of 50% corresponding to an ideal duty ratio. According to an example embodiment of the inventive concept, the duty adjuster 112 may adjust the duty of the data DQ based on a duty control signal Ctrl_D to output duty-adjusted data DQ_D. As an example, the duty adjuster 112 may control at least one of a rising slew rate and a falling slew rate of the data DQ.

A duty controller 130 may generate the duty control signal Ctrl_D based on a training result of the training circuit 120 described in the above-described embodiment. For example, the duty control signal Ctrl_D may include control information for increasing a logic high period or a logic low period of the data DQ, and the control information may be a control code including one or more bits. The duty adjuster 112 may perform a duty adjustment operation such that the duty ratio of the duty-adjusted data DQ_D has a value of about 50% in response to the duty control signal Ctrl_D.

According to the example embodiment of the inventive concept as described above, even when one read reference voltage is applied in common to a plurality of DQ lines having different swing levels, the duty of data may be adjusted differently based on a training result for the plurality of DQ lines, and thus, a duty deviation of data of the DQ lines may be corrected, thereby securing an optimal VWM.

Figure 3:
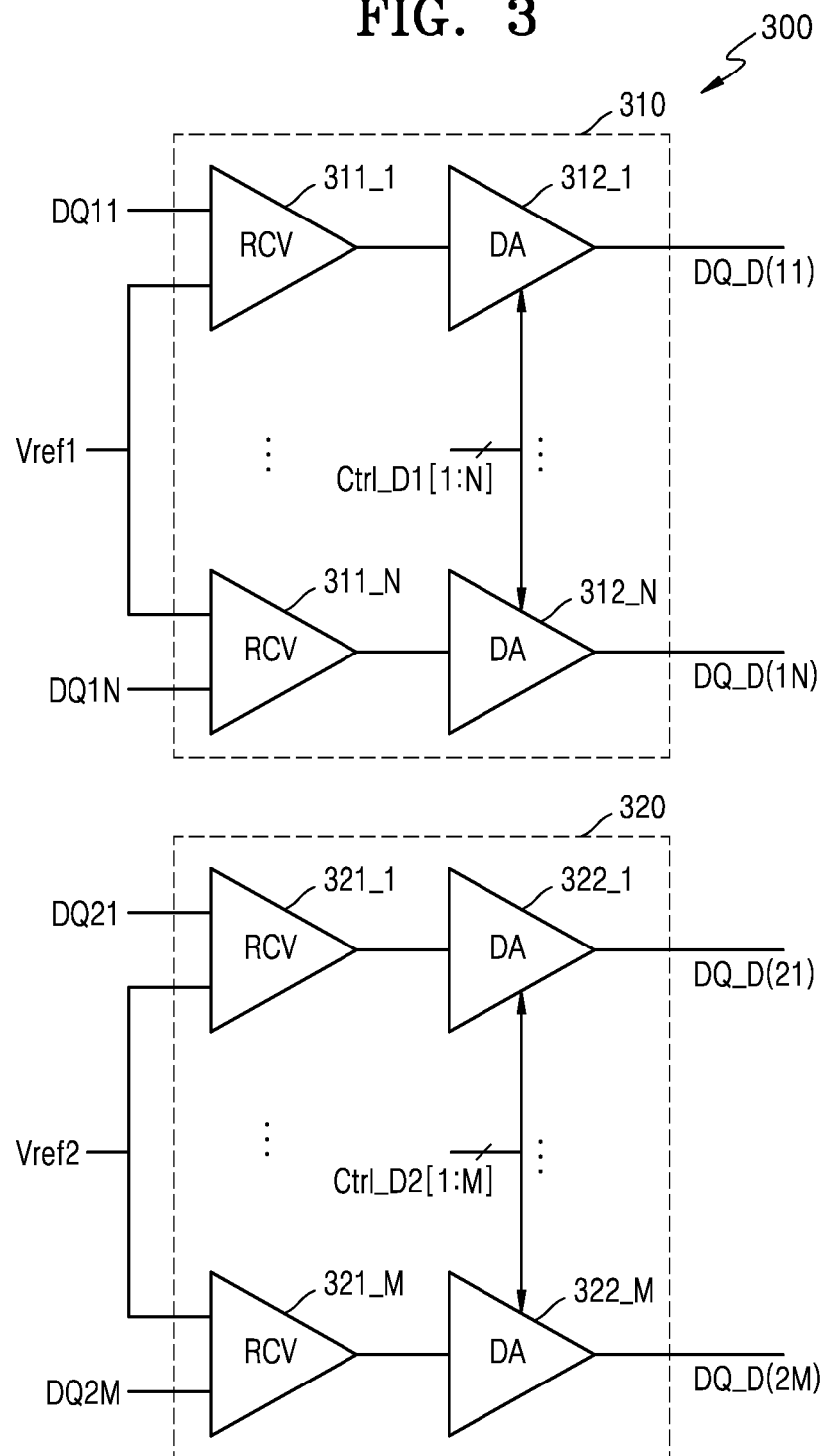
FIG. 3 is a block diagram illustrating a plurality of receivers and a plurality of duty adjusters arranged to correspond to a plurality of DQ lines.

FIG. 3 is a block diagram illustrating a plurality of receivers and a plurality of duty adjusters arranged to correspond to a plurality of DQ lines. FIG. 3 illustrates an example in which a plurality of DQ lines are grouped into two or more groups and a read reference voltage is set differently for each group. As an example, when 16 DQ lines for transmitting 16-bit data in parallel are arranged between a memory controller and a memory device, 8 DQ lines may constitute a first group, and the remaining 8 DQ lines may constitute a second group.

FIG. 3 illustrates an example in which a DDR PHY 300 includes a first receiving circuit 310 and a second receiving circuit 320 respectively corresponding to a first group and a second group. However, embodiments of the inventive concept are not limited thereto. For example, the DDR PHY 300 may include a larger number of receivers and a larger number of DQ lines may be grouped into three or more groups.

As shown in FIG. 3, the first receiving circuit 310 may include N receivers 311_1 to 311_N for receiving data DQ11 to DQ1N transmitted through N DQ lines, and N duty adjusters 312_1 to 312_N arranged to respectively correspond to the N receivers 311_1 to 311_N. The N duty adjusters 312_1 to 312_N may output duty-adjusted data DQ_D(11) to DQ_D(1N). In addition, the second receiving circuit 320 may include M receivers 321_1 to 321_M for receiving data DQ21 to DQ2M transmitted through M DQ lines, and M duty adjusters 322_1 to 322_M arranged to respectively correspond to the M receivers 321_1 to 321_M. The M duty adjusters 322_1 to 322_M may output duty-adjusted internal data DQ_D(21) to DQ_D(2M). In an embodiment, the number N of the first group and the number M of the second group may be different from each other or equal to each other (that is, the first group and the second group include the same number of DQ lines).

In an example embodiment of the inventive concept, a training circuit (e.g., the training circuit 120 of FIG. 1) may perform a training operation on the N data DQ11 to DQ1N and the M data DQ21 to DQ2M. In addition, as an example, the training circuit may set a first read reference voltage Vref1 for the first receiving circuit 310 and a second read reference voltage Vref2 for the second receiving circuit 320 through a training operation. For example, the training circuit may calculate optimal read reference voltages for respective pieces of the data DQ11 to DQ1N through training on the data DQ11 to DQ1N in relation to the first group, and the first read reference voltage Vref1 may be set based on the calculated optimal read reference voltages. Similarly, the training circuit may calculate optimal read reference voltages for respective pieces of the data DQ21 to DQ2M through training on the data DQ21 to DQ2M in relation to the second group, and the second read reference voltage Vref2 may be set based on the calculated optimal read reference voltages.

According to an example embodiment, the duty of data may be corrected based on the optimal read reference voltages calculated for each piece of data and the common read reference voltage calculated in common for pieces of data by searching for a VWM of the data during a training process. For example, a correction value for each piece of data may be calculated based on a difference between the level of an optimal read reference voltage calculated for each of pieces of the data DQ11 to DQ1N of the first group and the level of a common read reference voltage (or the first read reference voltage Vref1) that is set for the data DQ11 to DQ1N of the first group, and a first duty control signal Ctrl_D1[1:N] may be generated based on the calculated correction value and provided to the N duty adjusters 312_1 to 312_N. Because the plurality of DQ lines of the first group may have different swing level characteristics, the N duty adjusters 312_1 to 312_N may differently adjust the duty of a corresponding piece of data.

Similarly, a correction value for each piece of data may be calculated based on a difference between the level of an optimal read reference voltage calculated for each of pieces of the data DQ21 to DQ2M of the second group and the level of a common read reference voltage (or the second read reference voltage Vref2) that is set for the data DQ21 to DQ2M of the second group, and a second duty control signal Ctrl_D2[1:M] may be generated based on the calculated correction value and provided to the M duty adjusters 322_1 to 322_M. Because the plurality of DQ lines of the second group may have different swing level characteristics, the M duty adjusters 322_1 to 322_M may differently adjust the duty of data of a corresponding piece of data.

According to the example embodiment shown in FIG. 3, in a memory system that transmits and receives data through a plurality of DQ lines, read reference voltages for some DQ lines are different from read reference voltages for some other DQ lines and data is read using the different read reference voltages. Therefore, compared to the case where one read reference voltage is used, data reception characteristics may be improved. For example, by grouping DQ lines that are physically adjacent to each other and/or having similar swing level characteristics and setting the level of a read reference voltage for each group, a level difference between an optimal read reference voltage of each DQ line and the read reference voltage set for each group may be relatively reduced, and thus, a duty deviation of data within the same group may be reduced. In addition, training may be performed for each group, and deviation of a swing level between a plurality of DQ lines in the same group may be reduced through the duty correction operation according to example embodiments.

Figure 4:
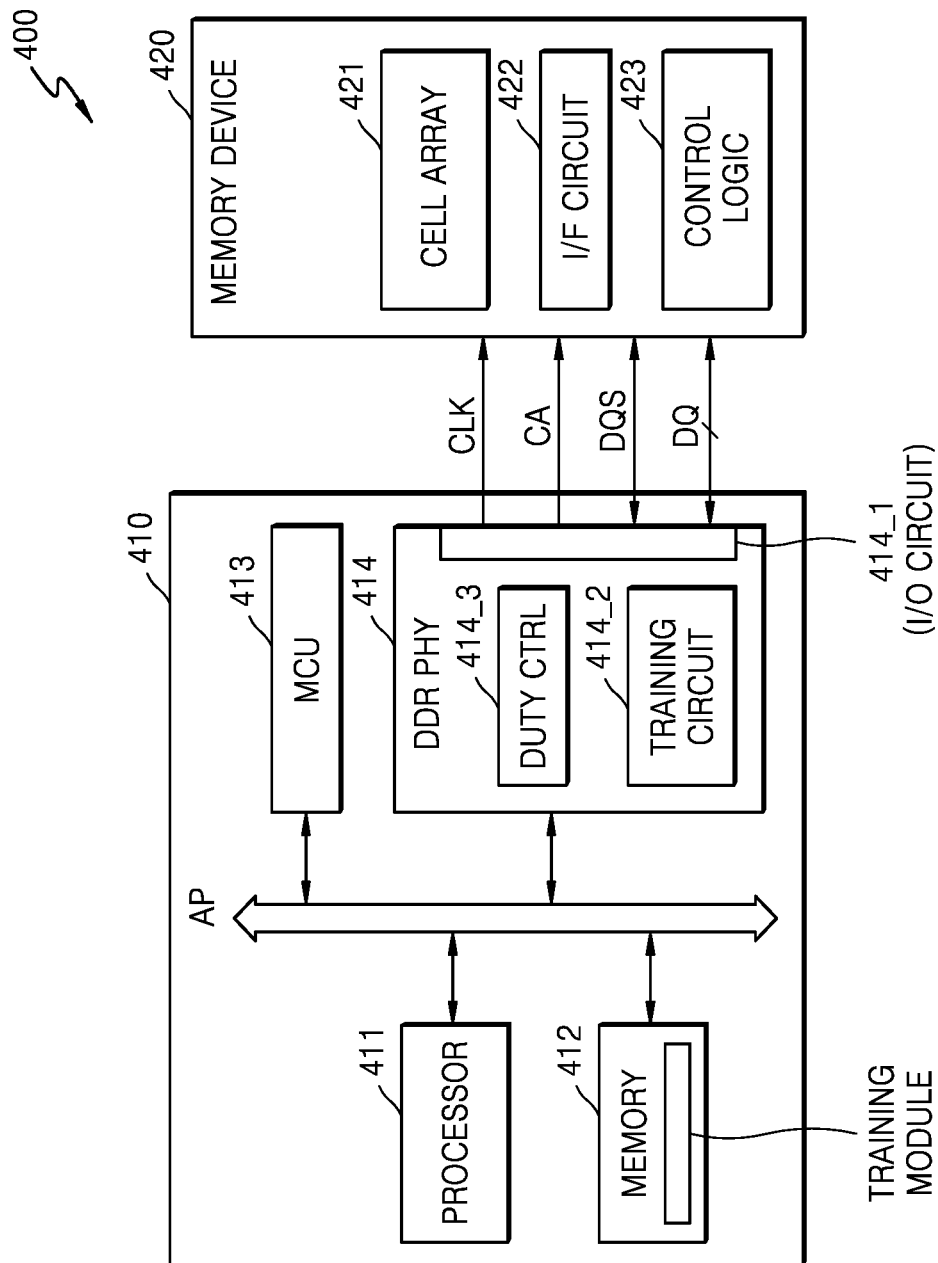
FIG. 4 is a block diagram of a memory system including a system-on-chip (SoC) according to an example embodiment of the inventive concept.

FIG. 4 is a block diagram of a memory system 400 including a system-on-chip (SoC) according to an example embodiment of the inventive concept. As shown in FIG. 4, the memory system 400 may include an application processor 410 and a memory device 420, and the application processor 410 may be implemented as an SoC. The memory device 420 may include a cell array 421, an interface circuit 422, and control logic 423, and the interface circuit 422 may include a DDR PHY.

The application processor 410 may include various intellectual properties (IPs). As an example, the application processor 410 may include a processor 411 that controls operations of the memory system 400, such as memory operations, and a memory 412 that stores instructions executable by the processor 411. According to an example embodiment of the inventive concept, various instructions for controlling a training operation may be stored as a training module in the memory 412, and the processor 411 may control a training operation according to example embodiments by executing the training module. For example, the processor 411 may control a training circuit 414_2 based on a result of executing the training module.

The application processor 410 may further include a memory control module (MCU) 413 that controls a memory operation of the memory device 420 based on the control of the processor 411, and a DDR PHY 414 that provides a memory interface. The DDR PHY 414 may include an input/output circuit 414_1, a training circuit 414_2, and a duty controller 414_3. According to an embodiment, the MCU 413 and the memory device 420 may be referred to as constituting a memory system, and the application processor 410 and the memory device 420 may be referred to as constituting a data processing system.

Various types of system bus standards may be applied to the application processor 410. For example, an Advanced Microcontroller Bus Architecture (AMBA) protocol of Advanced RISC Machine (ARM) Ltd. may be applied to the application processor 410. The bus type of the AMBA protocol may include Advanced High-Performance Bus (AHB), Advanced Peripheral Bus (APB), Advanced eXtensible Interface (AXI), AXI4, and AXI Coherency Extensions (ACE). In addition, other types of protocols such as uNetwork of Sonics Inc, CoreConnect of IBM, and Open Core Protocol of OCP-IP may be applied.

As described above, the DDR PHY 414 may provide a clock signal CLK and a command/address CA to the memory device 420 and transmit/receive a data strobe signal DQS and data DQ to/from the memory device 420. In addition, the input/output circuit 414_1 may include receivers and duty adjusters according to example embodiments, and as an example, may receive or output a plurality of bits of data DQ in parallel through a plurality of DQ lines. Also, the training circuit 414_2 may perform training on the data DQ to correct the duty of the data DQ according to example embodiments. Also, the duty controller 414_3 may output a duty control signal for controlling the duty adjusters of the input/output circuit 414_1 based on a training result of the training circuit 414_2.

In addition, according to example embodiments, as the same read reference voltage is provided to a plurality of receivers of the input/output circuit 414_1 and duty control signals having different values based on a training result are provided to the duty adjusters, the duties of pieces of data DQ output from the plurality of receivers may be differently adjusted by the corresponding duty adjusters.

Figure 5:
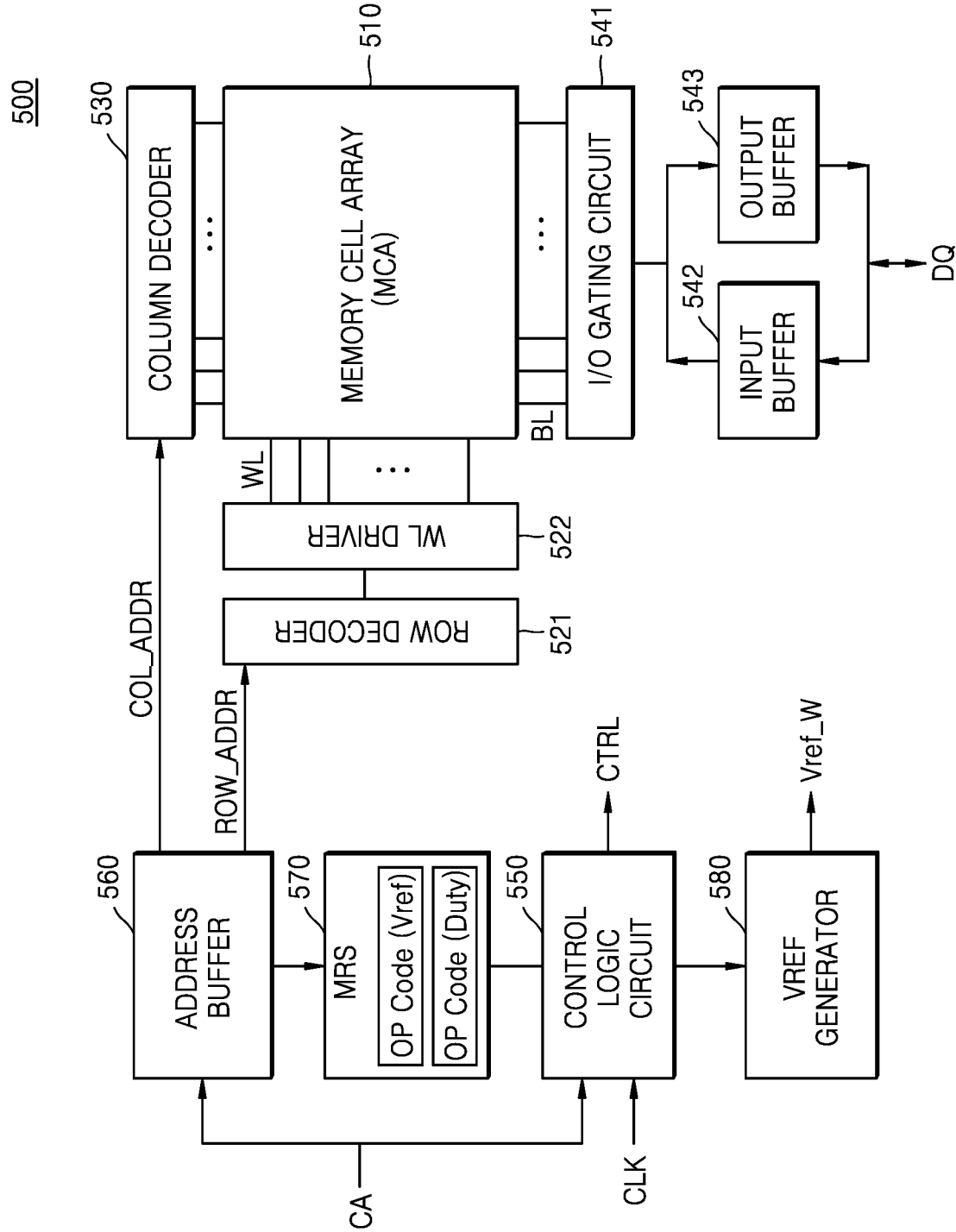
FIG. 5 is a block diagram of a memory device according to an example embodiment of the inventive concept.

FIG. 5 is a block diagram of a memory device 500 according to an example embodiment of the inventive concept.

Referring to FIG. 5, the memory device 500 may include a cell array 510, a row decoder 521, a word line driver 522, a column decoder 530, an input/output gating circuit 541, an input buffer 542, an output buffer 543, a control logic circuit 550, an address buffer 560, a mode register set (MRS) 570, and a reference voltage generator 580.

The cell array 510 includes a plurality of memory cells arranged in rows and columns. The cell array 510 includes a plurality of word lines WL and a plurality of bit lines BL connected to the memory cells. The plurality of word lines WL may be connected to rows of the memory cells, and the plurality of bit lines BL may be connected to columns of the memory cells.

The row decoder 521 may select a word line WL corresponding to a row address ROW_ADDR by decoding the row address ROW_ADDR received from the address buffer 560, and may be connected to the word line driver 522 that activates the selected word line WL. The column decoder 530 may decode a column address COL_ADDR received from the address buffer 560 and generate a column selection signal, and may connect bit lines BL selected by the column selection signal to the input/output gating circuit 541. Read data DQ provided to the input/output gating circuit 541 may be provided to a memory controller through the output buffer 543, and write data DQ from the memory controller may be provided to the input/output gating circuit 541 through the input buffer 542.

The control logic circuit 550 may receive a clock signal CLK and a command/address CA from the memory controller and generate a control signal CTRL for controlling various internal operations of the memory device 500. The MRS 570 may include a register that stores operation codes including various types of control parameters related to memory operations in order to set operating conditions for the memory device 500. The operation codes may be provided to the memory device 500 through a command/address (CA) bus and stored in the MRS 570, and the control logic circuit 550 may set various operating conditions of the memory device 500 by executing the operation codes stored in the MRS 570. In addition, the reference voltage generator 580 may generate various reference voltages related to a memory operation and, for example, may generate a write reference voltage Vref_W as a reference for determining a logic state of data during a data write operation.

According to an example embodiment of the inventive concept, duty correction for data may also be applied to the memory device 500. For example, the memory controller may perform various training operations (e.g., write data training) for the memory device 500, and may set, in the MRS 570, an operation code related to the level of the write reference voltage Vref_W based on a training result. Also, the input buffer 542 of the memory device 500 may include a plurality of receivers for receiving write data DQ through a plurality of DQ lines, and a plurality of duty adjusters connected to outputs of the plurality of receivers.

By performing training on the memory device 500, a VWM of the write data DQ transmitted to the memory device 500 through the plurality of DQ lines may be searched for, and the level of an optimal write reference voltage for each write data DQ may be calculated. In addition, the level of the write reference voltage Vref_W provided in common to the plurality of receivers of the input buffer 542 during a data write operation may be set. The memory controller may set, in the MRS 570, an operation code OP Code (Vref) indicating the level of the write reference voltage Vref_W calculated through the training process.

Also, according to example embodiments, the duty of write data DQ may be corrected based on a difference between the level of an optimal write reference voltage for each write data DQ and the level of a common write reference voltage for pieces of write data DQ, and by repeating a training process of searching for the VWM in a state in which the duty is corrected, a correction value for each of the pieces of write data DQ may be calculated. In addition, an operation code OP Code (Duty) for compensating for a duty deviation of outputs of the plurality of receivers of the input buffer 542 may be generated based on the calculated correction value, and the operation code OP Code (Duty) may be set in the MRS 570. The memory device 500 may control the duty adjustment characteristics of a plurality of duty adjusters connected to the outputs of the plurality of receivers, based on the operation code OP Code (Duty) set in the MRS 570 in a data writing process.

Figure 6:
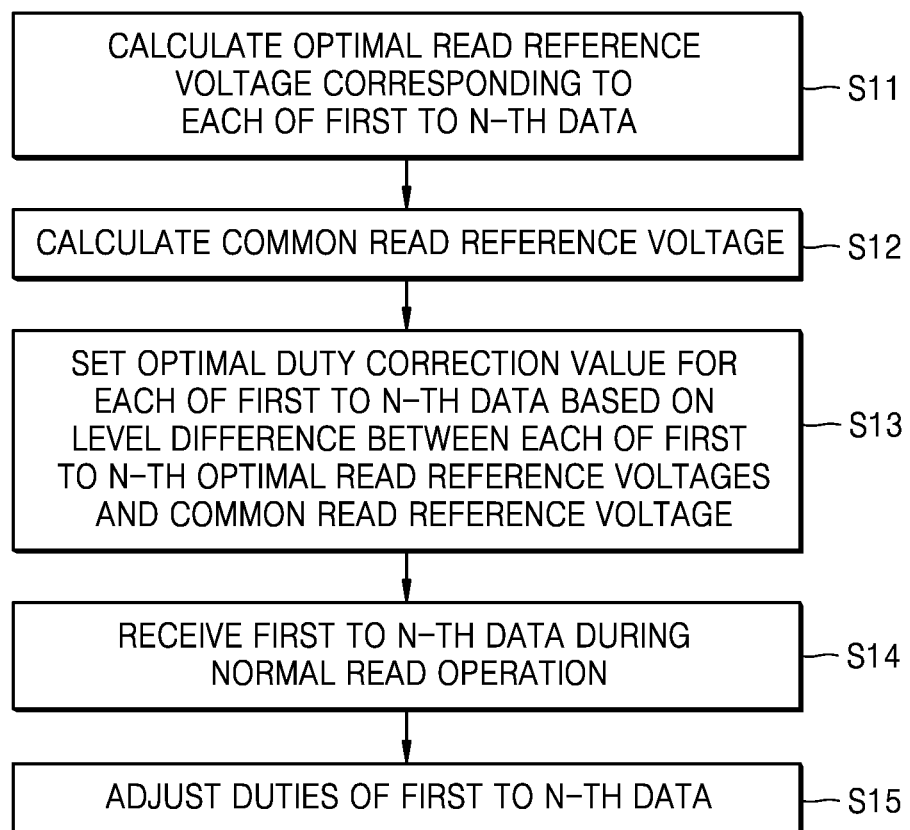
FIG. 6 is a flowchart illustrating an operating method of a memory controller according to an example embodiment of the inventive concept.

FIG. 6 is a flowchart illustrating an operating method of a memory controller according to an example embodiment of the inventive concept.

The memory controller may receive data including a plurality of bits in parallel through a plurality of DQ lines, and may perform a training operation based on the data received in parallel. For example, by searching for a VWM of data output from a receiver arranged for each of the DQ lines during a training operation, the level of an optimal read reference voltage may be calculated for each piece of data. For example, first to N-th optimal read reference voltages may be calculated corresponding to first to N-th pieces of data (operation S11).

In addition, a common read reference voltage common to pieces of data may be calculated by searching for a VWM for the pieces of data (operation S12), and an operation for correcting a duty deviation of read data may be performed based on the previously calculated optimal read reference voltages of the pieces of data and the common read reference voltage common to the pieces of data. As an example, by correcting the duties of at least some of the first to N-th pieces of data based on a level difference between each of the first to N-th optimal read reference voltages and the common read reference voltage and repeating a process of searching for a VWM in a state in which the duties are corrected, an optimal duty correction value for each of the first to N-th pieces of data may be set (operation S13).

The memory controller may store the duty correction value in an internal memory (e.g., a register) and generate first to N-th duty control signals for adjusting the duty of read data based on the stored duty correction value. In a normal operation after the training operation is completed, the memory controller may receive the first to N-th data through data lines according to a data read operation (operation S14), and the duties of the first to N-th data may be adjusted by providing the first to N-th duty control signals generated based on the set duty correction value to first to N-th duty adjusters arranged to correspond to the data lines (operation S15).

Figure 7:
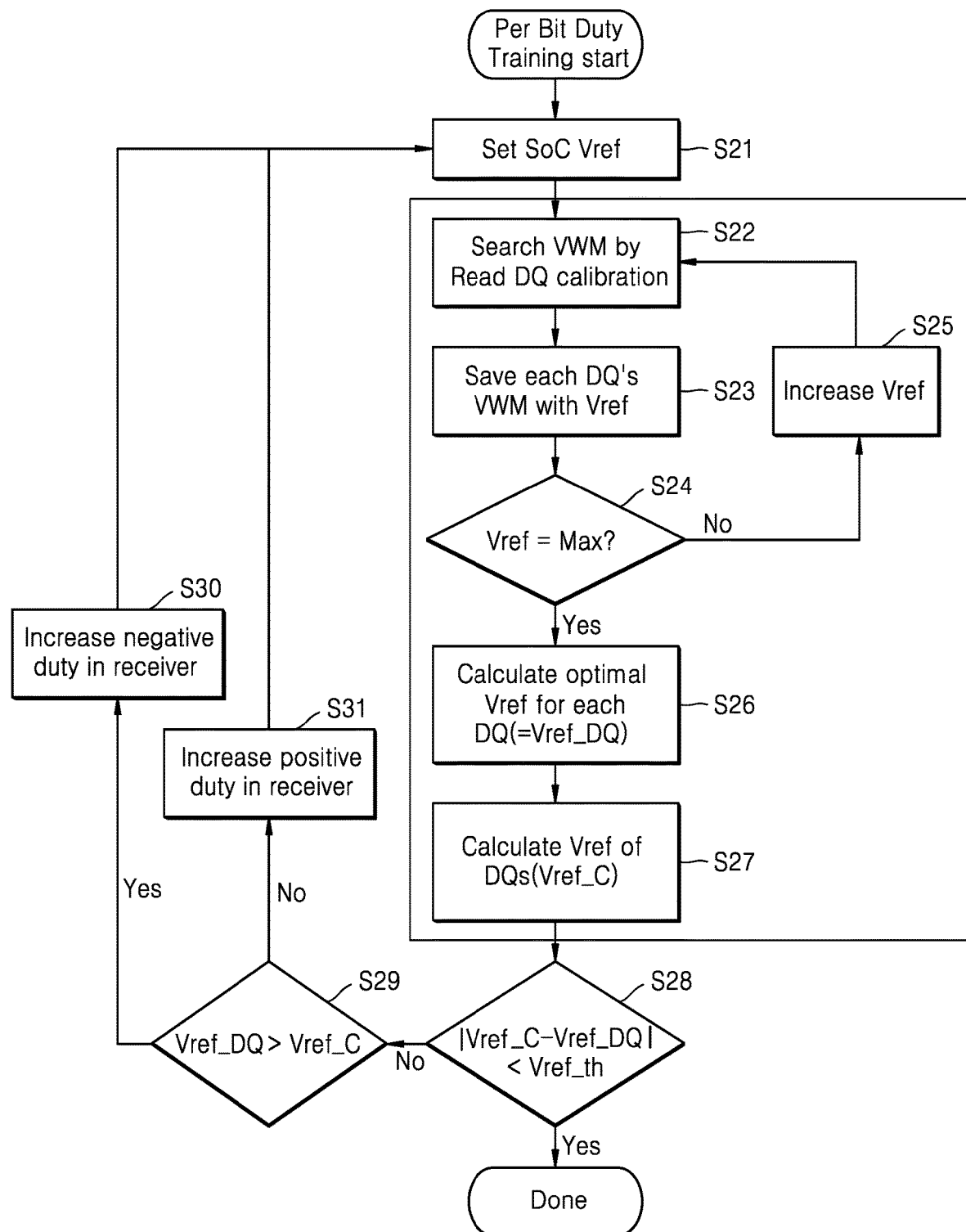
FIG. 7 is a flowchart illustrating an example of a detailed training operation according to an example embodiment of the inventive concept.

FIG. 7 is a flowchart illustrating an example of a detailed training operation according to an example embodiment of the inventive concept. In describing configurations shown in FIG. 7, descriptions given in relation to any data (or, may be referred to as bits, data bits, etc.) may be applied in common to training of other data. In an embodiment of the inventive concept, a training operation may be performed in parallel on pieces of data. In addition, in FIG. 7, an SoC is exemplified as a memory controller communicating with a memory device.

Referring to FIG. 7, training (or duty training) for data bits may be performed, and the duty training process may include a training operation for a read reference voltage. As an example, the level of a read reference voltage generated in an SoC may be set to an initial level to be used in the training (operation S21), and the read reference voltage having the initial level may be provided to receivers in a DDR PHY. In addition, by performing calibration on read data Read DQ based on the initial level, a VWM may be searched for each piece of data (operation S22). The training circuit in an example embodiment may include a calculation logic for searching for a VWM for each piece of data, and information related to the VWM searched for each piece of data and information related to the level of a read reference voltage applied to the search for the VWM may be stored (operation S23).

After the information related to the VWM for each piece of data obtained based on the initial level is stored, a process of searching for the VWM for each piece of data while changing the level of the read reference voltage may be repeated. Assuming that the initial level of the read reference voltage corresponds to a minimum level and the VWM is searched for while increasing the level of the read reference voltage, it may be determined whether the voltage level of the current read reference voltage is a maximum level (Max). When the voltage level of the current read reference voltage is not the maximum level, the voltage level of the read reference voltage may be increased according to a certain set value (operation S25), and a process of searching for a VWM for each piece of data by performing calibration on the read data Read DQ may be repeated.

When a training operation using read reference voltages having a certain level range is completed, information related to a VWM searched for corresponding to the level of each of the read reference voltages may be stored, and a process of calculating an optimal read reference voltage for each piece of data based on the stored information may be performed (operation S26). The training circuit in an example embodiment may include a calculation logic that calculates an optimal read reference voltage for each piece of data based on information about the VWM searched for and stored for each piece of data and calculates a common read reference voltage common to pieces of data. As an example, VWM information corresponding to read reference voltages with various levels for each piece of data may be checked, and a read reference voltage corresponding to a VWM having the best characteristic may be determined as an optimal read reference voltage Vref_DQ for corresponding piece of data. Also, a window period that is valid in common for pieces of data may be determined by searching for a VWM of the pieces of data, and a common read reference voltage Vref_C may be determined based on the window period (operation S27). The process of calculating an optimal read reference voltage level of each of pieces of data and a common read reference voltage level of the pieces of data while changing the level of the read reference voltage as described above may be referred to as a calculation operation.

After the optimal read reference voltage Vref_DQ for each piece of data and the common read reference voltage Vref_C for the pieces of data are calculated as described above, an operation of correcting the duties of at least some of the pieces of data may be performed. The training circuit according to an example embodiment may include an operation logic for correcting the duty of data by determining a level difference between the optimal read reference voltage Vref_DQ and the common read reference voltage Vref_C. According to various embodiments, when a training circuit and a duty controller are separately implemented, the training circuit may provide the duty controller with, as a correction value, information (or level difference information) related to the levels of the optimal read reference voltage Vref_DQ and the common read reference voltage Vref_C, and the duty controller may generate a duty control signal based on the received correction value.

According to an example embodiment, a level difference between the optimal read reference voltage Vref_DQ and the common read reference voltage Vref_C for each piece of data may be compared with a threshold value Vref_th (operation S28). When the level difference in certain data is less than the threshold value Vref_th, it may indicate that the level of the optimal read reference voltage Vref_DQ and the level of the common read reference voltage Vref_C are similar to each other, and accordingly, the duty of corresponding data, that is, the certain data, may not be corrected.

On the other hand, when the level difference between the optimal read reference voltage Vref_DQ and the common read reference voltage Vref_C is greater than the threshold value Vref_th, it may indicate that a level difference between an optimal read reference voltage for improving a VWM of a corresponding piece of data and a read reference voltage actually applied to the corresponding piece of data is large, and accordingly, the duty of the corresponding piece of data may be corrected. For example, when an optimal read reference voltage Vref_DQ of a certain piece of data is greater than the common read reference voltage Vref_C, a duty control signal for increasing a negative duty (e.g., a logic low duty) of the piece of data may be generated (operation S30). On the other hand, when the optimal read reference voltage Vref_DQ of data is smaller than the common read reference voltage Vref_C, a duty control signal for increasing a positive duty (e.g., a logic high duty) of the piece of data may be generated. (S31). The process of correcting the duty of data based on a difference between an optimal read reference voltage level and a common read reference voltage level, as described above, may be referred to as a correction operation.

The duty may be corrected for at least some of pieces of data through the above process, and the calculation operation and the correction operations may be repeatedly performed in a state in which the duty of the at least some of pieces of data is corrected. Because the calculation operation and the correction operation are repeatedly performed based on the operations shown in FIG. 7, as the duty of data of the at least some of pieces of data is repeatedly corrected, a level difference between an optimal read reference voltage Vref_DQ and a common read reference voltage Vref_C of the at least some of pieces of data may be gradually reduced. When it is determined that a level difference between the optimal read reference voltage Vref_DQ and the common read reference voltage Vref_C for all pieces of data is less than the threshold value Vref_th through the above process, the training process may be terminated. In addition, as training is performed while correcting the duty of data, a duty correction value satisfying a condition that a level difference between the optimal read reference voltage Vref_DQ and the common read reference voltage Vref_C for each piece of data is less than the threshold value Vref_th may be determined, and the duty correction value or a duty control signal generated based on the duty correction value may be stored in the SoC.

Figure 8A:
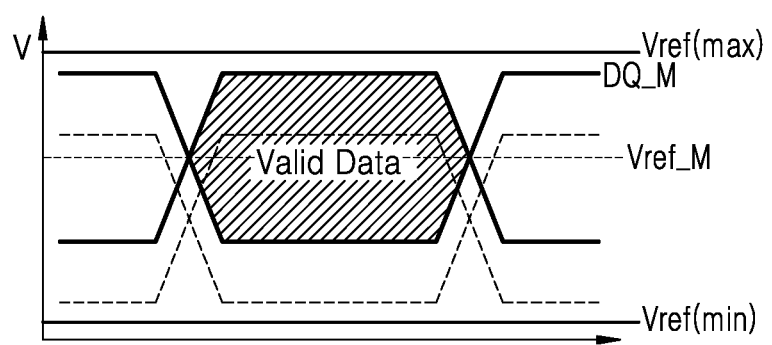
FIGS. 8A to 8C are diagrams illustrating an example of calculating an optimal read reference voltage and a common read reference voltage, according to example embodiments of the inventive concept.
Figure 8B:
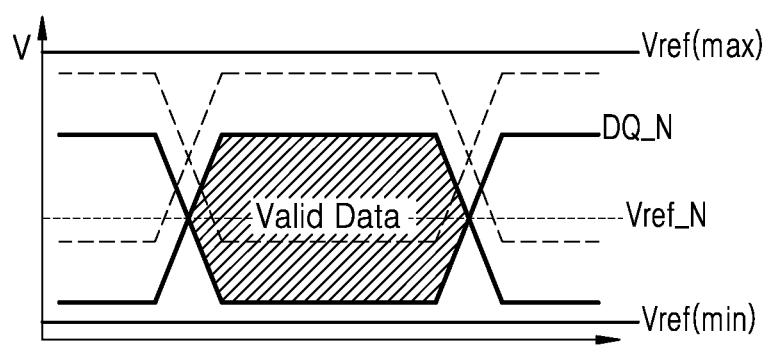
Figure 8C:
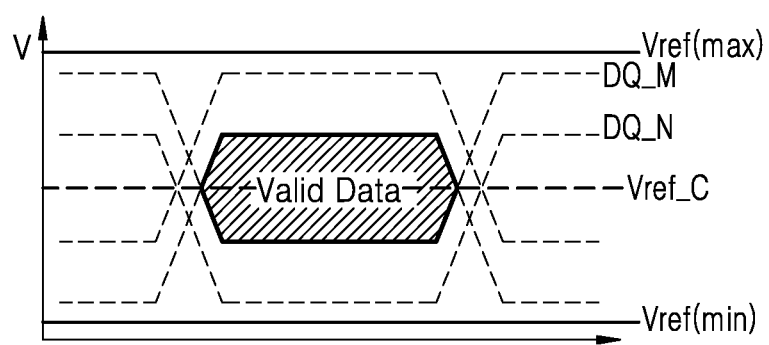

FIGS. 8A to 8C are diagrams illustrating an example of calculating an optimal read reference voltage and a common read reference voltage, according to an example embodiment of the inventive concept.

Referring to FIG. 8A, a VWM of pieces of data may be searched for, and in FIG. 8A, a swing level of data DQ_M having the highest swing level from among the pieces of data is exemplified. During a training process, a VWM of the data DQ_M may be searched for while the level of a read reference voltage of the data DQ_M is changed between a minimum level Vref(min) and a maximum level Vref(max), and the level of an optimal read reference voltage Vref_M corresponding to the data DQ_M may be calculated.

Also, in FIG. 8B, a swing level of data DQ_N having the lowest swing level from among the pieces of data is exemplified. During a training process, a VWM of the data DQ_N may be searched for while the level of a read reference voltage of the data DQ_N is changed between a minimum level Vref(min) and a maximum level Vref(max), and the level of an optimal read reference voltage VrefN corresponding to the data DQ_N may be calculated. Also, the level of the optimum read reference voltage VrefN of the data DQ_N may be less than the level of the optimum read reference voltage Vref_M of the data DQ_M.

A swing level of all pieces of data may have a value between levels shown in FIGS. 8A and 8B, and, when swing levels of the pieces of data overlap each other, a valid window period of the pieces of data may be searched for as shown in FIG. 8C. Also, the level of a common read reference voltage Vref_C for all pieces of data may be calculated based on a waveform shown in FIG. 8C, and the level of the common read reference voltage Vref_C may have a value between the level of the optimal read reference voltage Vref_M and the level of the optimum read reference voltage VrefN.

Figure 9:
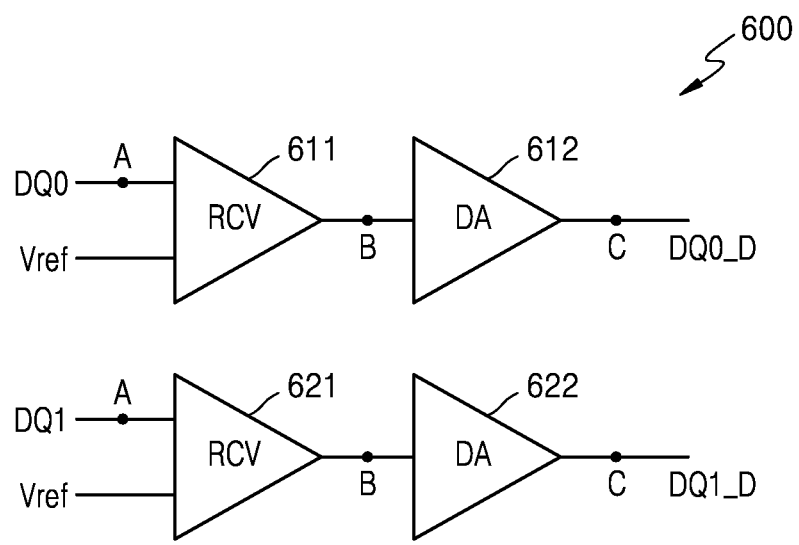
FIGS. 9, 10A, and 10B are diagrams illustrating an operation of adjusting a duty of data, according to example embodiments of the inventive concept.
Figure 10A:
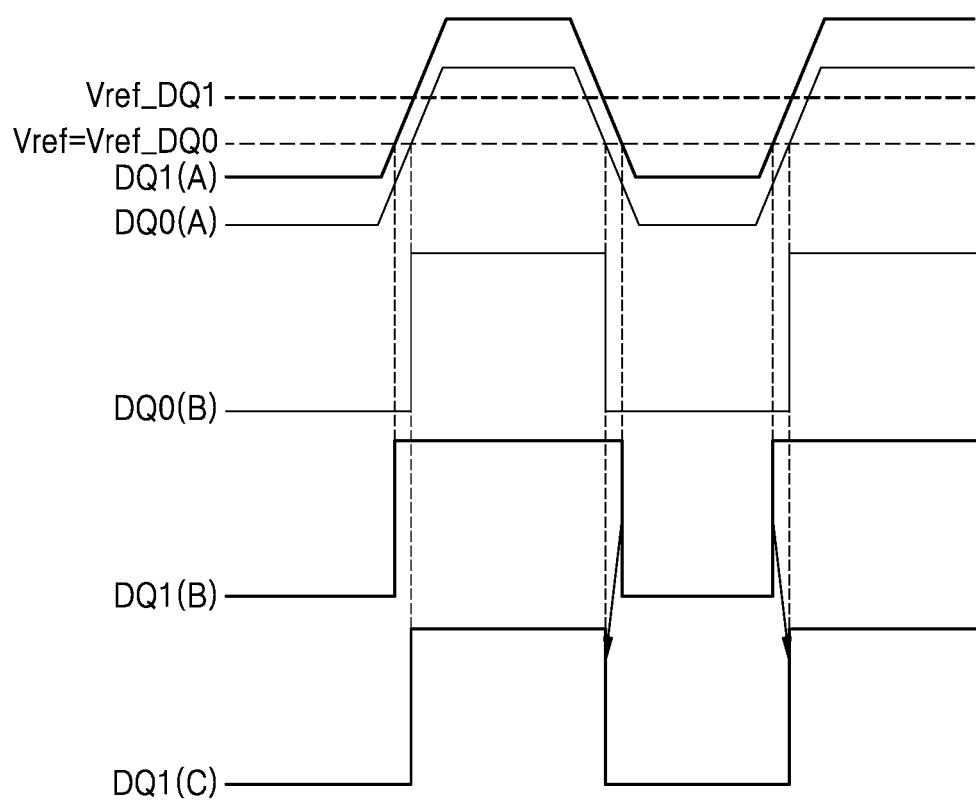
Figure 10B:
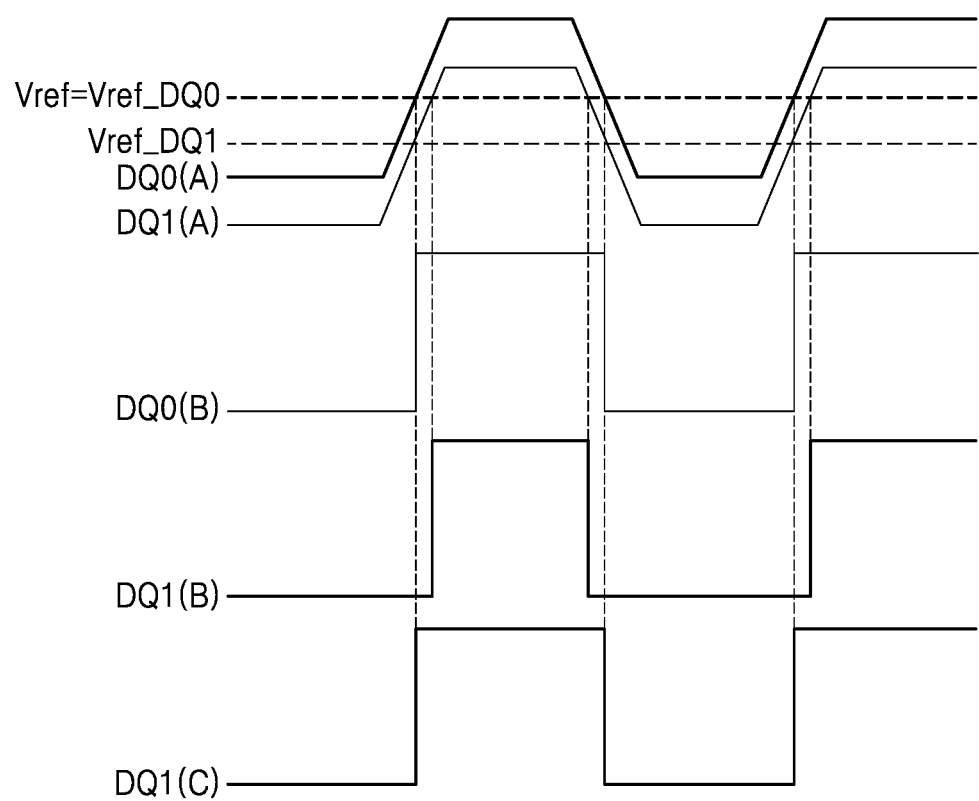

FIGS. 9, 10A, and 10B are diagrams illustrating an operation of adjusting the duty of data, according to an example embodiment of the inventive concept. As an example, FIGS. 9, 10A, and 10B may correspond to a normal read operation of a memory system.

Referring to FIG. 9, a memory controller 600 may include a plurality of receivers (data receivers) and duty adjusters corresponding thereto. In FIG. 9, a first receiver 611 and a first duty adjuster 612, which are arranged to correspond to a first DQ line, and a second receiver 621 and a second duty adjuster 622, which are arranged to correspond to a second DQ line, are exemplified. The first receiver 611 may receive first data DQ0 from a memory device (not shown) through the first DQ line, the second receiver 621 may receive second data DQ1 from the memory device (not shown) through the second DQ line, and a read reference voltage Vref may be provided in common to the first receiver 611 and the second receiver 621.

The output of the first receiver 611 may be provided to the first duty adjuster 612, and the first duty adjuster 612 may adjust the duty of the output of the first receiver 611 in response to a first duty control signal Ctrl_D0 (not shown), thereby outputting duty-adjusted first data DQ0_D. In addition, the output of the second receiver 621 may be provided to the second duty adjuster 622, and the second duty adjuster 622 may adjust the duty of the output of the second receiver 621 in response to a second duty control signal Ctrl_D1 (not shown), thereby outputting duty-adjusted second data DQ1_D. Also, as the value of the first duty control signal Ctrl_D0 is different from the value of the second duty control signal Ctrl_D1, the first duty adjuster 612 and the second duty adjuster 622 may have different duty adjusting characteristics.

A node to which data is input is defined as A, an output node of each of the first and second receivers 611 and 621 is defined as B, and an output node of each of the first and second duty adjusters 612 and 622 is defined as C. In addition, it is assumed that the level of an optimal read reference voltage Vref_DQ0 calculated for the first data DQ0 is equal to the level of a read reference voltage Vref, which is provided in common to the plurality of receivers.

Referring to FIGS. 9 and 10A, the first receiver 611 may compare the first data DQ0 provided through the first DQ line with the read reference voltage Vref, and as the level of the read reference voltage Vref is equal to the level of the optimal read reference voltage Vref_DQ0 calculated for the first data DQ0, the duty ratio of a signal output from the first receiver 611 may be approximately 50%, which may indicate that the VWM of the first data DQ0 has good characteristics. Accordingly, the first duty adjuster 612 may not perform duty correction on the output signal of the first receiver 611 or a correction amount by the first duty adjuster 612 may be relatively small.

On the other hand, the second receiver 621 may compare the second data DQ1 provided through the second DQ line with the read reference voltage Vref, and as the level of the read reference voltage Vref is less than the level of an optimal read reference voltage Vref_DQ1 calculated for the second data DQ1, the logic high level period of a signal output from the second receiver 621 may be greater than the logic low level period of the signal. The second duty adjuster 622 may perform an adjustment operation to reduce the logic high level period of the output signal of the second receiver 621. As an example, the second duty adjuster 622 may decrease the rising slew rate of the output signal of the second receiver 621 while increasing the falling slew rate of the output signal.

In FIG. 10B, a case in which correction for increasing the logic high level period is performed is exemplified.

Referring to FIGS. 9 and 10B, the first receiver 611 may compare the first data DQ0 provided through the first DQ line with the read reference voltage Vref, and as the level of the read reference voltage Vref is equal to the level of the optimal read reference voltage Vref_DQ0 calculated for the first data DQ0, the first duty adjuster 612 may not perform duty correction on the output signal of the first receiver 611 or a correction amount by the first duty adjuster 612 may be relatively small.

On the other hand, the second receiver 621 may compare the second data DQ1 provided through the second DQ line with the read reference voltage Vref, and as the level of the read reference voltage Vref is greater than the level of the optimal read reference voltage Vref_DQ1 calculated for the second data DQ1, the logic low level period of the signal output from the second receiver 621 may be greater than the logic high level period of the signal. The second duty adjuster 622 may perform an adjustment operation to increase the logic high level period of the output signal of the second receiver 621. As an example, the second duty adjuster 622 may increase the rising slew rate of the output signal of the second receiver 621 while decreasing the falling slew rate of the output signal.

Figure 11:
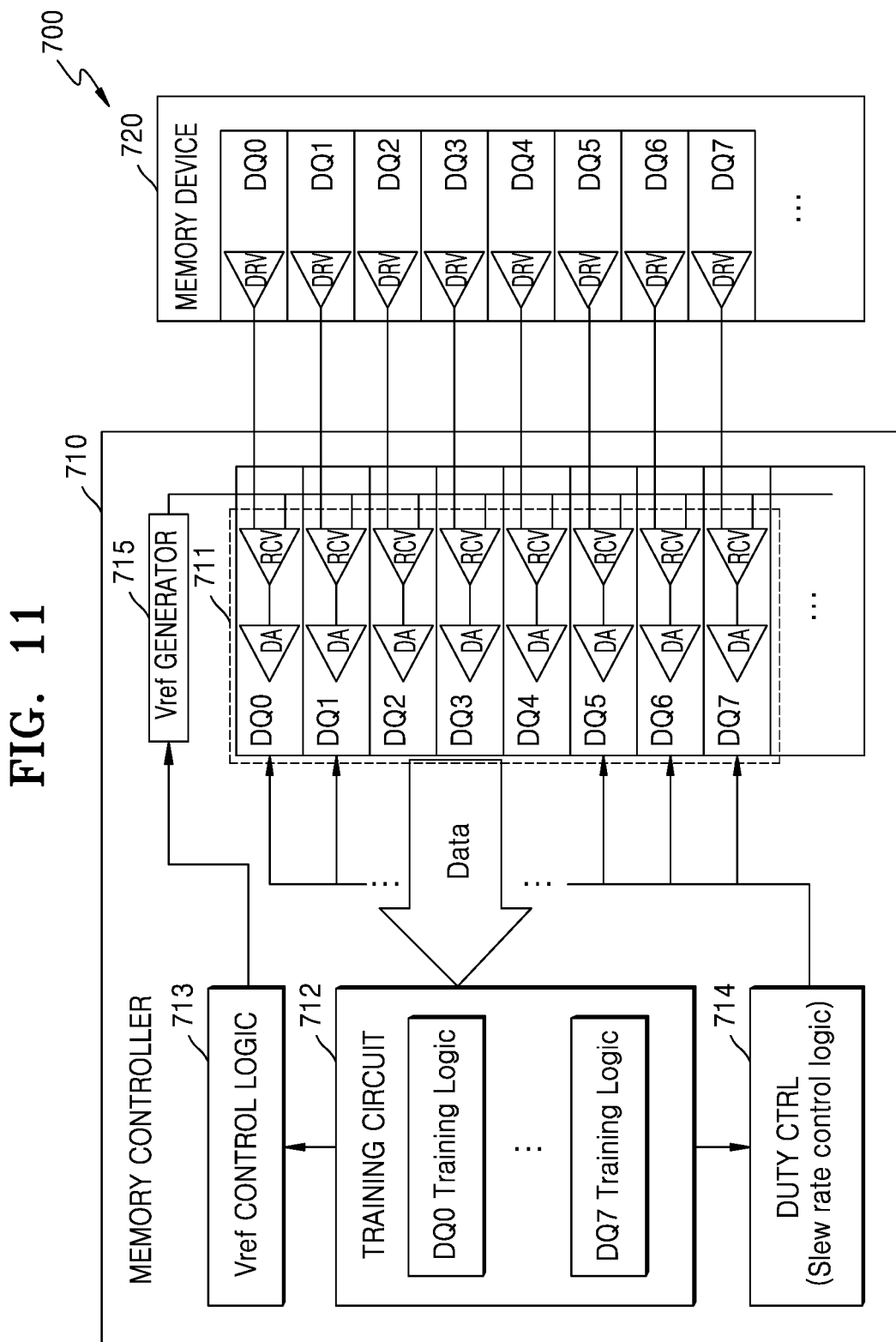
FIGS. 11 and 12 are block diagrams illustrating an implementation example of a memory system according to example embodiments of the inventive concept.
Figure 12:
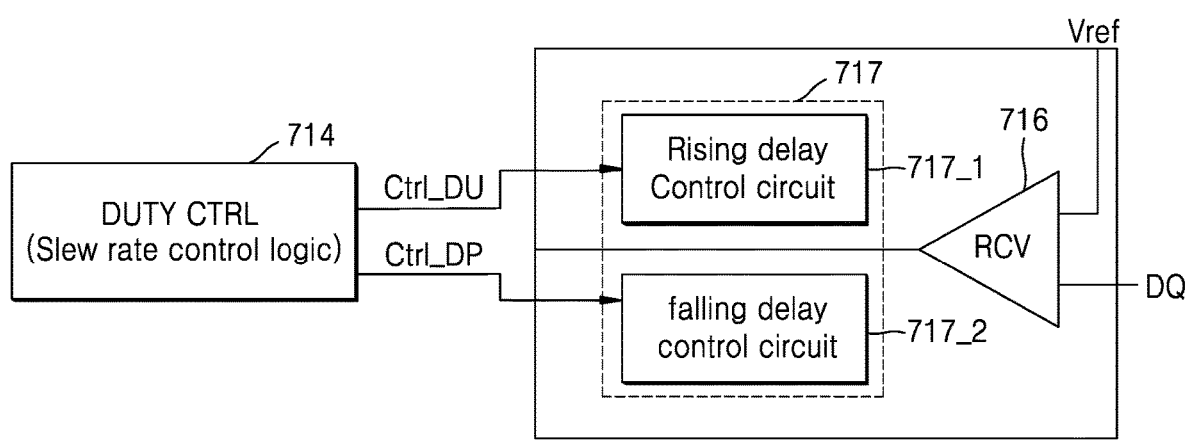

FIGS. 11 and 12 are block diagrams illustrating an implementation example of a memory system according to an example embodiment of the inventive concept.

Referring to FIG. 11, a memory system 700 may include a memory controller 710 and a memory device 720, and the memory controller 710 may include an input/output circuit 711, a training circuit 712, a reference voltage controller 713, a duty controller 714, and a reference voltage generator 715. Also, the memory device 720 may include an interface circuit that communicates with the memory controller 710, and a plurality of drivers that output pieces of data (e.g., first to eighth data DQ0 to DQ7). Although not shown in FIG. 11, the memory controller 710 may further include various other components such as a processor and an operation memory, related to the control of the memory device 720. In addition, at least some of the components of the memory controller 710 illustrated in FIG. 11 may be included in a DDR PHY.

The input/output circuit 711 may include a plurality of receivers RCV for receiving in parallel the first to eighth data DQ0 to DQ7 output from the plurality of drivers of the memory device 720. In addition, according to embodiments of the inventive concept, a plurality of duty adjusters DA may be arranged to correspond to the plurality of receivers RCV. In a training process of the memory system 700, the training circuit 712 may control a training operation for various signals used for a memory operation. As an example, the training circuit 712 may control a training operation for securing a VWM of the pieces of data, that is, the first to eighth data DQ0 to DQ7. As an example, the training operation may include an operation of setting a correction value for correcting the duty of each piece of data based on the level of an optimal read reference voltage calculated for each piece of data, according to example embodiments. According to example embodiments, the correction value may correspond to a duty control signal in example embodiments, or may be information used to generate the duty control signal.

The training circuit 712 may include training logics for parallelly performing a training operation on the pieces of data, that is, the first to eighth DQ0 to DQ7, and may control the reference voltage controller 713 and the duty controller 714 based on a training result. The reference voltage controller 713 may adjust the level of a read reference voltage Vref generated by the reference voltage generator 715, based on the control of the training circuit 712. Also, the duty controller 714 may control the duty (or slew rate) of data output from a receiver based on the control of the training circuit 712.

Referring to FIG. 12, the duty controller 714 according to embodiments of the inventive concept may adjust the duty of a piece of data by adjusting a rising slew rate and a falling slew rate of the piece of data. For example, the duty adjuster 717 may include a rising delay control circuit 717_1 and a falling delay control circuit 717_2, connected to an output terminal of a receiver 716. A rising slew rate may be adjusted by controlling a delay, in which a piece of data is changed from logic low to logic high, by the rising delay control circuit 717_1, and a falling slew rate may be adjusted by controlling a delay, in which the piece of data changes from logic high to logic low, by the falling delay control circuit 717_2. Although not shown in FIG. 12, the rising delay control circuit 717_1 may include a plurality of switches (e.g., PMOS transistors) arranged in parallel and connected to a power supply voltage, and the falling delay control circuit 717_2 may include a plurality of switches (e.g., NMOS transistors) arranged in parallel and connected to a ground voltage.

The duty controller 714 may output a duty control signal according to example embodiments, and the duty control signal may include a first duty control signal Ctrl_DU provided to the rising delay control circuit 717_1 and a second duty control signal Ctrl_DP provided to the falling delay control circuit 717_2, and accordingly, the rising slew rate and the falling slew rate may be separately controlled. As an example, a resistance value according to turn-on states of the switches of the rising delay control circuit 717_1 may be changed according to the value of the first duty control signal Ctrl_DU, and a rising slew rate of data may be accordingly adjusted. Similarly, a falling slew rate of data may be adjusted according to the value of the second duty control signal Ctrl_DP, which controls turn-on states of the switches of the falling delay control circuit 717_2.

Figure 13:
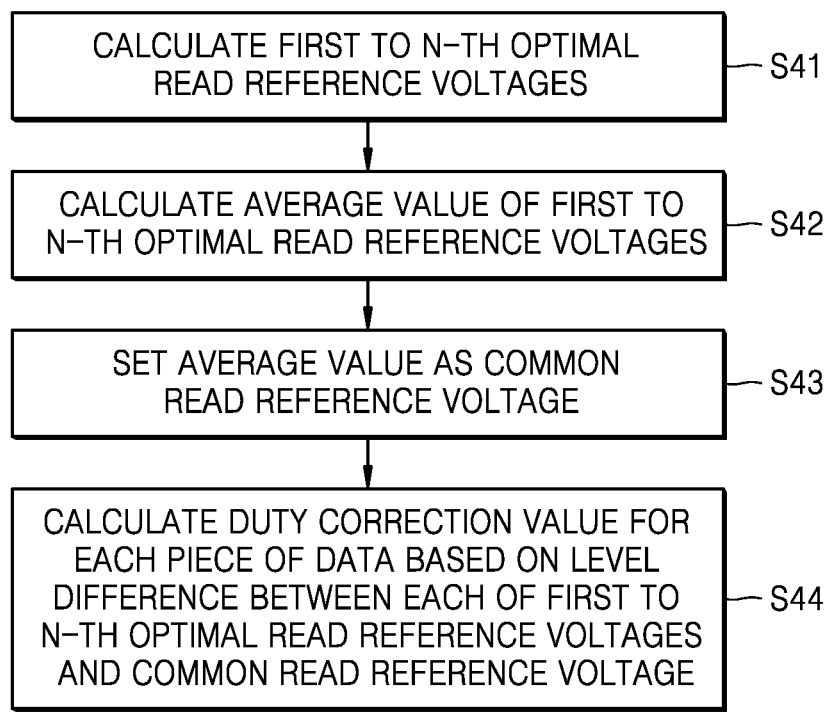
FIGS. 13 and 14 are diagrams illustrating examples of calculating a level of a common read reference voltage during a training process according to example embodiments of the inventive concept.
Figure 14:
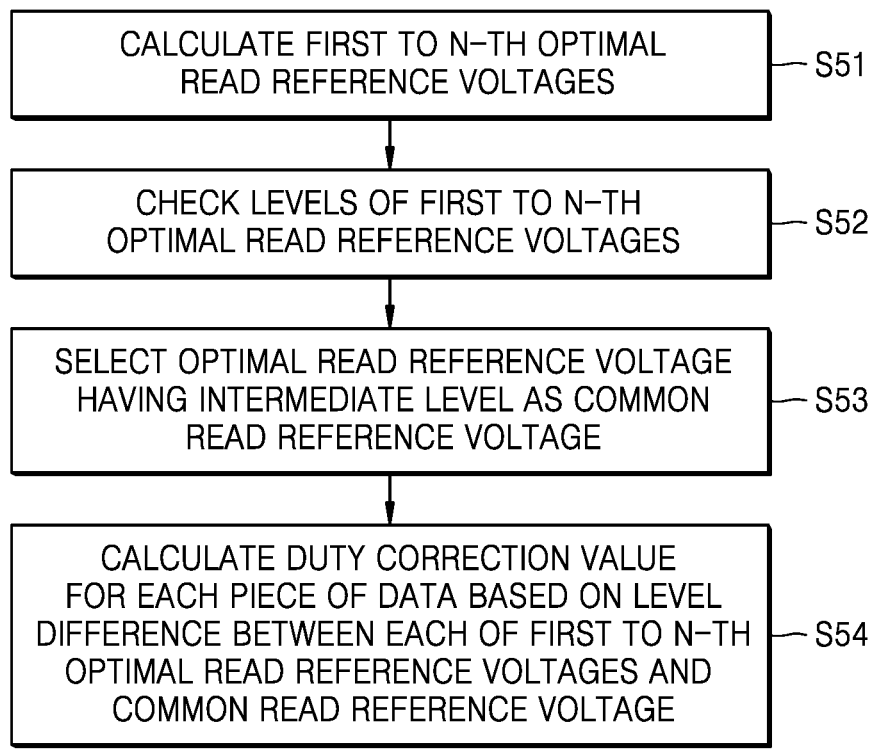

FIGS. 13 and 14 are diagrams illustrating examples of calculating a level of a common read reference voltage during a training process according to example embodiments of the inventive concept.

Referring to FIG. 13, an optimal read reference voltage may be calculated for each of pieces of data through the above-described training process, and as an example, first to N-th optimal read reference voltages may be calculated (operation S41). Also, based on a result of calculating the first to N-th optimal read reference voltages, a rough average value thereof may be calculated (operation S42), and the calculated average value may be set as a common read reference voltage for the pieces of data (operation S43). In addition, a duty correction value may be calculated for each piece of data based on a level difference between each of the first to N-th optimal read reference voltages and the common read reference voltage during the training process (operation S44).

Referring to FIG. 14, the first to N-th optimal read reference voltages may be calculated through the above-described training process (operation S51). Also, the levels of the first to N-th optimal read reference voltages may be checked based on a result of the calculating (operation S52), and an optimal read reference voltage having a roughly intermediate level from among the first to N-th optimal read reference voltages may be selected as a common read reference voltage for the pieces of data (operation S53). Also, in the training process, a duty correction value may be calculated for each piece of data based on a level difference between each of the first to N-th optimal read reference voltages and the common read reference voltage (operation S54).

Figure 15:
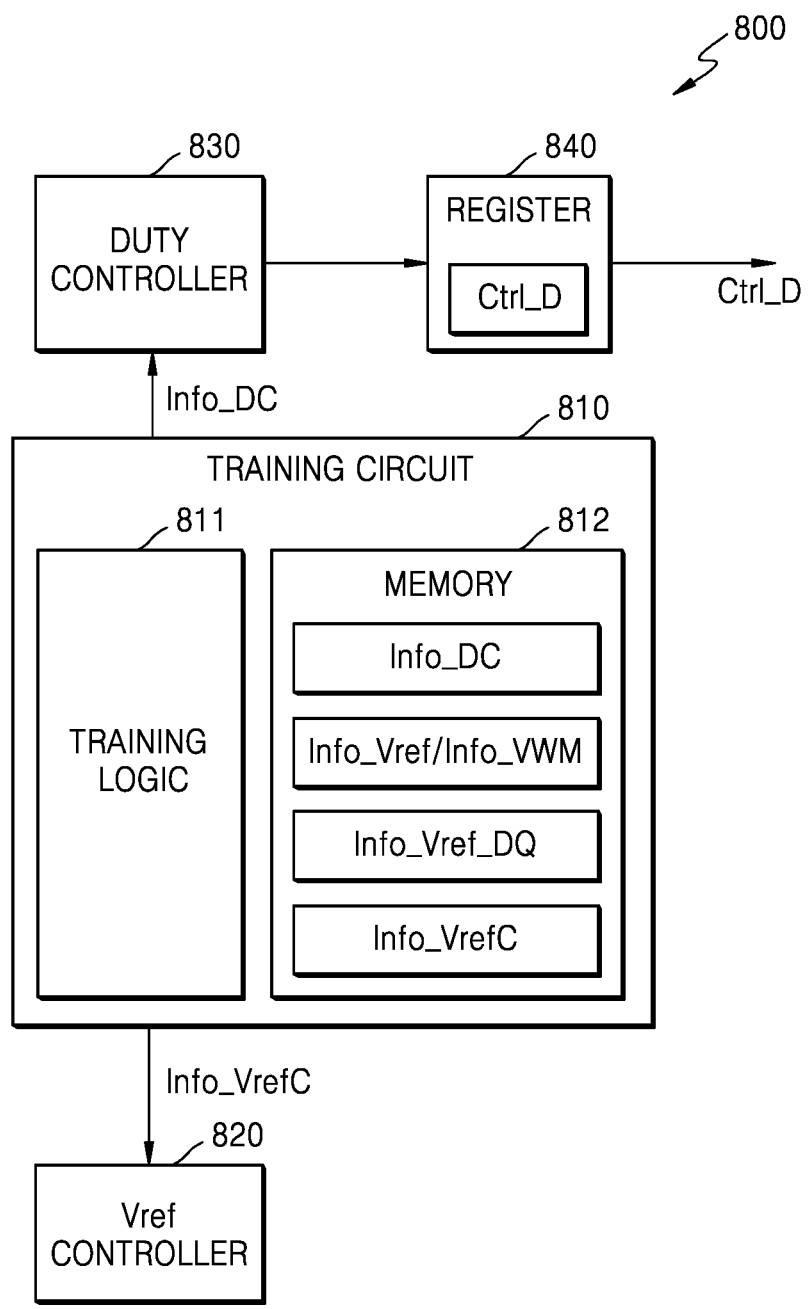
FIG. 15 is a block diagram illustrating an example of storing information generated in a training process according to example embodiments of the inventive concept.

FIG. 15 is a block diagram illustrating an example of storing information generated in a training process according to example embodiments of the inventive concept.

Referring to FIG. 15, a memory controller 800 may include a training circuit 810, a reference voltage controller 820, a duty controller 830, and a register 840, and the training circuit 810 may include a training logic 811 for performing training on pieces of data, and a memory 812 for storing various information related to training. In the embodiment shown in FIG. 15, the memory 812 is illustrated as being provided in the training circuit 810, but the memory 812 may be provided outside the training circuit 810.

According to example embodiments, the training circuit 810 may perform training while changing the level of a read reference voltage, and thus may store, in the memory 812, first information Info_Vref related to the level of the read reference voltage and second information Info_VWM related to a VWM searched for to correspond to the first information Info_Vref. Also, the training circuit 810 may calculate an optimal read reference voltage for each piece of data based on the stored first and second information Info_Vref and Info_VWM, and may store third information Info_Vref_DQ related to the optimal read reference voltage in the memory 812. Also, the training circuit 810 may calculate a common read reference voltage for the pieces of data, and may store fourth information Info_Vref_C related to the common read reference voltage in the memory 812. Also, the training circuit 810 may generate fifth information Info_DC related to a duty correction value calculated for each piece of data according to example embodiments and store the generated fifth information Info_DC in the memory 812.

The training circuit 810 may provide various types of information for setting memory operations based on a training result. For example, the training circuit 810 may provide the fourth information Info_Vref_C to the reference voltage controller 820, and may provide the fifth information Info_DC to the duty controller 830. The reference voltage controller 820 may generate a reference voltage control signal based on the fourth information Info_Vref_C and provide the generated reference voltage control signal to a reference voltage generator that generates a read reference voltage. Also, the duty controller 830 may generate a duty control signal Ctrl_D for each piece of data based on the fifth information Info_DC, and the generated duty control signal Ctrl_D may be stored in the register 840. Also, as the memory controller 800 performs a normal memory operation, the duty control signal Ctrl_D stored in the register 840 may be provided to a duty adjuster arranged for each piece of data line.

Figure 16:
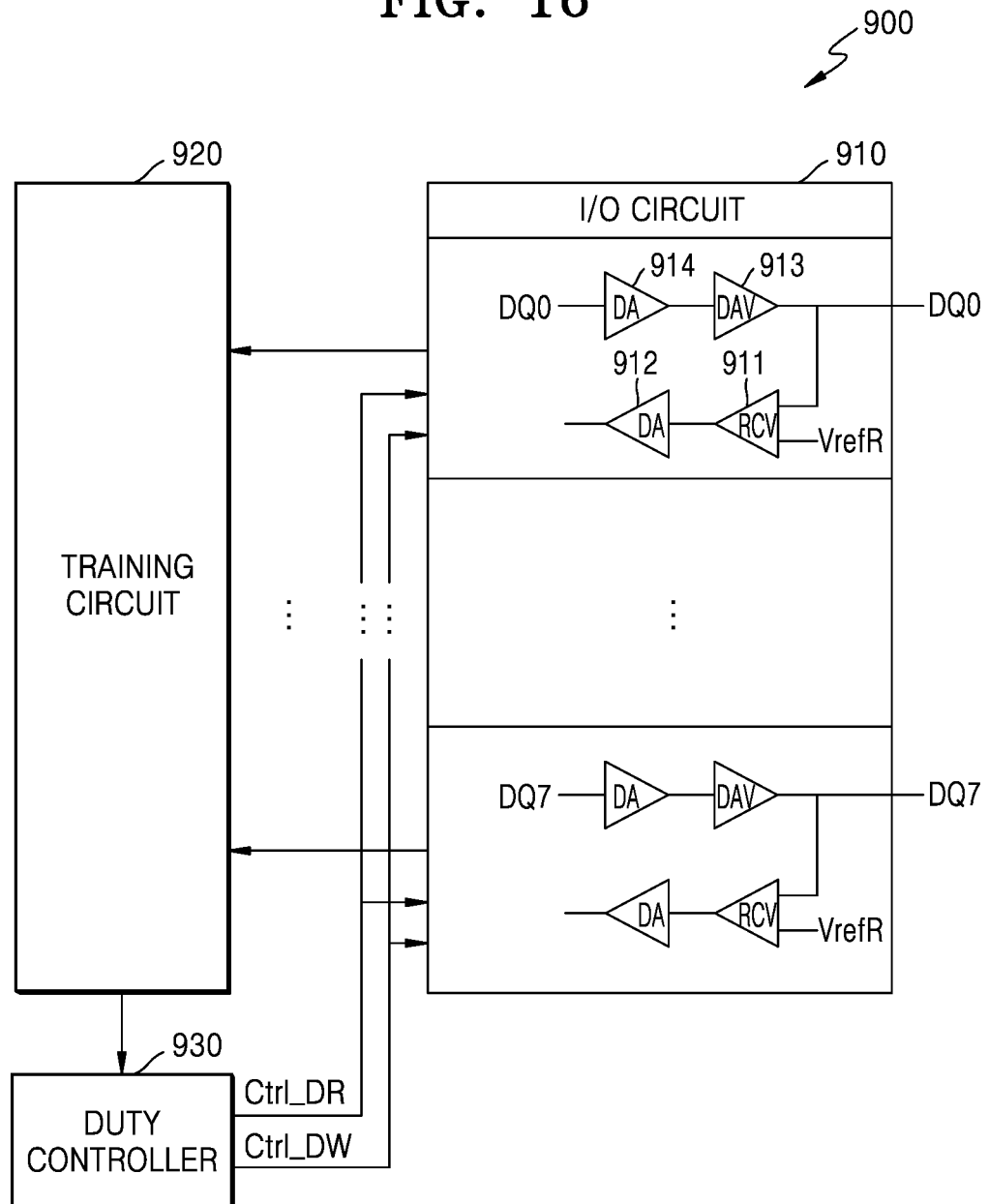
FIG. 16 is a block diagram of a memory controller that adjusts the duty of write data according to an example embodiment of the inventive concept.

FIG. 16 is a block diagram of a memory controller 900 that adjusts the duty of write data according to an example embodiment of the inventive concept. In the following embodiment, after write data is stored in a memory device, the write data may be read again and provided to the memory controller 900, and thus, data read and provided from the memory device during a training process of the write data may be referred to as write data.

Referring to FIG. 16, the memory controller 900 may include an input/output circuit 910, a training circuit 920, and a duty controller 930. In addition, the input/output circuit 910 may include a plurality of receivers for receiving pieces of data DQ0 to DQ7 in parallel, and according to embodiments of the inventive concept, a plurality of duty adjusters may be arranged to correspond to the plurality of receivers. In addition, the input/output circuit 910 may include a plurality of drivers for outputting the pieces of data DQ0 to DQ7 in parallel, and according to embodiments of the inventive concept, a plurality of duty adjusters may be arranged to correspond to the plurality of drivers. For example, in relation to a first DQ line, the input/output circuit 910 may include a receiver 911 that receives first data (i.e., the data DQ0), a first duty adjuster 912 connected to an output of the receiver 911, a second duty adjuster 914 for adjusting the duty of the first data (i.e., the data DQ0) to be written to a memory device, and a driver 913 for outputting the duty-adjusted data. Also, in the embodiment shown in FIG. 16, the pieces of data DQ0 to DQ7 may be read data or write data. In addition, the second duty adjuster 914 may receive data corresponding to a digital signal and adjust the duty of the data, and the driver 913 may output the first data (i.e., the data DQ0) having a voltage level according to a logic state of the data.

The training circuit 920 may control a training operation according to example embodiments, and may perform training on pieces of read data and pieces of write data as an example. As an example, in relation to training on pieces of read data, the level of an optimal read reference voltage level for each of pieces of read data DQ0 to DQ7 may be calculated according to example embodiments, the level of a common read reference voltage for the pieces of read data DQ0 to DQ7 may be calculated, and a read reference voltage VrefR provided in common to the plurality of receivers may be calculated. In addition, based on a result of training performed on the pieces of read data DQ0 to DQ7, the duty controller 930 may generate a duty control signal (e.g., a read duty control signal Ctrl_DR) for adjusting the duty of each of the pieces of read data DQ0 to DQ7.

Also, the training circuit 920 may calculate the level of a write reference voltage (e.g., the write reference voltage Vref_W of FIG. 5) to be set in the memory device through training on pieces of write data DQ0 to DQ7, and may provide the memory device with setting information for setting the level of the write reference voltage.

According to example embodiments of the inventive concept, the training operation may include an operation for correcting the duty of the write data DQ0 to DQ7 in a data write operation. For example, the memory controller 900 may store the pieces of write data DQ0 to DQ7 in the memory device and read and receive the stored pieces of write data DQ0 to DQ7, and the training circuit 920 may calculate a correction value for correcting the duty of the received pieces of write data DQ0 to DQ7 by searching for a VWM of the received pieces of write data DQ0 to DQ7.

As an example, similar to the above-described data training process, the training circuit 920 may calculate an optimal write reference voltage for each piece of data by searching for a VWM of pieces of write data DQ0 to DQ7 read from the memory device while changing the level of a write reference voltage used in the memory device. In addition, the level of a common write reference voltage for the pieces of write data DQ0 to DQ7 may be calculated based on the optimal write reference voltages calculated for each of the pieces of write data DQ0 to DQ7, and a correction value for each piece of data may be calculated based on a level difference between the optimal write reference voltage calculated for each piece of data and the common write reference voltage.

The duty controller 930 may generate a duty control signal (e.g., a write duty control signal Ctrl_DW) for adjusting the duty of each of the pieces of write data DQ0 to DQ7 based on a result of training on the pieces of write data DQ0 to DQ7. Also, the generated write duty control signal Ctrl_DW may be provided to second duty adjusters of the input/output circuit 910. Also, by outputting duty-controlled write data DQ0 to DQ7 to the memory device, a VWM of write data DQ0 to DQ7 read and received from the memory device may be improved.

At least one of the components, elements, modules or units (collectively "components" in this paragraph) represented by a block in the drawings may be embodied as various numbers of hardware, software and/or firmware structures that execute respective functions described above, according to an example embodiment. According to example embodiments, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Functional aspects of the above exemplary embodiments may be implemented in algorithms that execute on one or more processors. Furthermore, the components represented by a block or processing steps may employ any number of related art techniques for electronics configuration, signal processing and/or control, data processing and the like.

While the inventive concept has been particularly shown and described with reference to example embodiments thereof, it will be understood that various changes in form and details may be made therein without departing from the spirit and scope of the following claims and their equivalents.

What is claimed is:

1. A memory controller in communication with a memory device, the memory controller comprising:
   a first receiver configured to compare a read reference voltage with a piece of data received through a first data line and configured to output a first piece of data;
   a first duty adjuster connected to an output of the first receiver and configured to adjust a duty of the first piece of data;
   a second receiver configured to compare the read reference voltage with a piece of data received through a second data line and configured to output a second piece of data;
   a second duty adjuster connected to an output of the second receiver and configured to adjust a duty of the second piece of data; and
   a training circuit configured to perform a training operation on pieces of data received through a plurality of data lines, to obtain a target read reference voltage for each of the pieces of data and correct a duty of each of the pieces of data based on a level of the target read reference voltage for each of the pieces of data,
   wherein based on a result of the training operation, the duty of the first piece of data and the duty of the second piece of data are differently adjusted based on a level of a first target read reference voltage obtained for the first piece of data being different from a level of a second target read reference voltage obtained for the second piece of data.

2. The memory controller of claim 1, further comprising:
a double data rate physical layer (DDR PHY),
wherein the DDR PHY includes the training circuit.

3. The memory controller of claim 1, wherein the training operation includes a training process of obtaining the target read reference voltage for each of the pieces of data and a common read reference voltage that is common to the pieces of data by searching for a valid window margin of the pieces of data while changing a level of the read reference voltage, and
wherein the training process is repeated by adjusting a duty of at least one piece of data of the pieces of data based on a difference between a level of the target read reference voltage for the at least one piece of data and a level of the common read reference voltage.

4. The memory controller of claim 3, wherein the training circuit is further configured to obtain, based on a result of repeating the training process while adjusting the duty of the at least one piece of data, a duty correction value for each of the pieces of data.

5. The memory controller of claim 3, wherein the training circuit is further configured to obtain the level of the common read reference voltage based on an average of levels of target read reference voltages obtained for the pieces of data.

6. The memory controller of claim 1, further comprising:
a duty controller configured to provide a first duty control signal and a second duty control signal to the first duty adjuster and the second duty adjuster, respectively,
wherein the duty controller is further configured to generate the first duty control signal and the second duty control signal based on the result of the training operation of the training circuit.

7. The memory controller of claim 1, wherein the first duty adjuster is further configured to, based on the level of the first target read reference voltage being lower than a level of the read reference voltage provided to the first receiver, adjust the duty of the first piece of data such that a logic high period of the first piece of data increases.

8. The memory controller of claim 1, wherein the first duty adjuster is further configured to, based on the level of the first target read reference voltage being higher than a level of the read reference voltage provided to the first receiver, adjust the duty of the first piece of data such that a logic low period of the first piece of data increases.

9. The memory controller of claim 1, wherein each of the first duty adjuster and the second duty adjuster includes a rising delay control circuit configured to adjust a rising slew rate of a corresponding piece of data and a falling delay control circuit configured to adjust a falling slew rate of the corresponding piece of data.

10. The memory controller of claim 1, further comprising:
a third receiver configured to compare the read reference voltage with a piece of data received through a third data line and output a third piece of data; and
a third duty adjuster connected to an output of the third receiver,
wherein the third duty adjuster is configured to, based on a level difference between a third target read reference voltage obtained for the third piece of data and the read reference voltage being less than a certain threshold value, not adjust a duty of the third piece of data.

\* \* \* \* \*